(12) United States Patent
Call et al.

(10) Patent No.: US 10,770,385 B2
(45) Date of Patent: Sep. 8, 2020

(54) CONNECTED PLANE STIFFENER WITHIN INTEGRATED CIRCUIT CHIP CARRIER

(71) Applicant: International Business Machines Corporation, Armonk, NY (US)

(72) Inventors: Anson J. Call, Poughkeepsie, NY (US); Brian W. Quinlan, Poughkeepsie, NY (US); Krishna R. Tunga, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/046,653

(22) Filed: Jul. 26, 2018

(65) Prior Publication Data

US 2020/0035593 A1   Jan. 30, 2020

(51) Int. Cl.
| | |
|---|---|
| *H01L 23/00* | (2006.01) |
| *H01L 23/498* | (2006.01) |
| *H01L 21/48* | (2006.01) |
| *H01L 23/10* | (2006.01) |
| *H01L 23/053* | (2006.01) |
| *H01L 23/367* | (2006.01) |

(52) U.S. Cl.
CPC ...... *H01L 23/49838* (2013.01); *H01L 21/486* (2013.01); *H01L 21/4857* (2013.01); *H01L 23/49822* (2013.01); *H01L 23/562* (2013.01); *H01L 23/053* (2013.01); *H01L 23/10* (2013.01); *H01L 23/3675* (2013.01); *H01L 23/49816* (2013.01); *H01L 24/16* (2013.01); *H01L 24/32* (2013.01); *H01L 24/73* (2013.01); *H01L 24/81* (2013.01); *H01L 2224/16225* (2013.01); *H01L 2224/32225* (2013.01); *H01L 2224/73204* (2013.01); *H01L 2224/81815* (2013.01); *H01L 2924/14* (2013.01); *H01L 2924/3511* (2013.01)

(58) Field of Classification Search
None
See application file for complete search history.

(56) References Cited

U.S. PATENT DOCUMENTS

| | | | |
|---|---|---|---|
| 4,988,577 A | 1/1991 | Jamieson | |
| 6,121,149 A | 9/2000 | Lukanc et al. | |
| 6,333,557 B1 | 12/2001 | Sullivan | |
| 6,506,979 B1 * | 1/2003 | Shelnut | H05K 3/3473 174/255 |
| 8,673,766 B2 | 3/2014 | Lin et al. | |
| 9,059,255 B2 | 6/2015 | Ryan et al. | |
| 9,440,135 B2 | 9/2016 | Hurwitz | |
| 9,455,224 B2 | 9/2016 | Boyanov et al. | |

(Continued)

*Primary Examiner* — Reema Patel
(74) *Attorney, Agent, or Firm* — ZIP Group PLLC

(57) ABSTRACT

An integrated circuit (IC) chip carrier includes an internal connected plane stiffener. The connected plane stiffener includes a first plane connected to a second plane by a channel via. The first plane is separated from the second plane a plane separation dielectric layer. The channel via is within the plane separation dielectric layer. The first plane and the second plane resist bending moments internal to the IC chip carrier. The channel via resists shear forces internal to the IC chip carrier. The first plane and the second plane may be both power planes that distributes power potential within the IC chip carrier. The first plane and the second plane may be both ground planes that distributes ground potential within the IC chip carrier.

8 Claims, 10 Drawing Sheets

(56) References Cited

U.S. PATENT DOCUMENTS

| | | |
|---|---|---|
| 9,615,447 B2 | 4/2017 | Hurwitz |
| 2004/0169198 A1* | 9/2004 | Nagata .............. H01L 23/49822 257/200 |
| 2006/0267201 A1 | 11/2006 | Huebler et al. |
| 2016/0381800 A1 | 12/2016 | Yagnamurthy et al. |

* cited by examiner

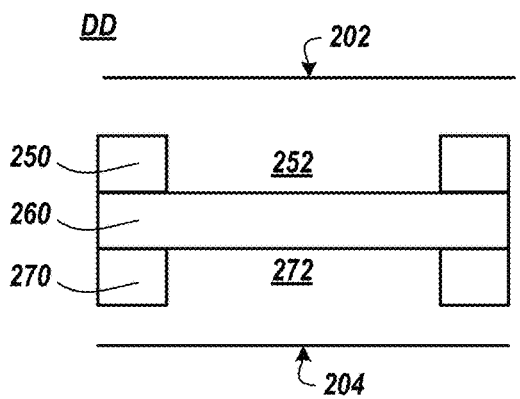 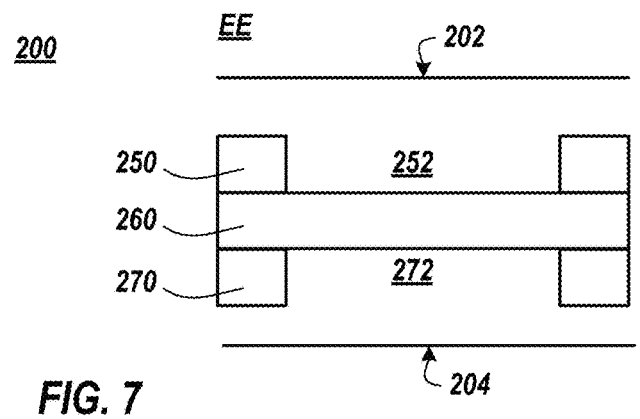
FIG. 7
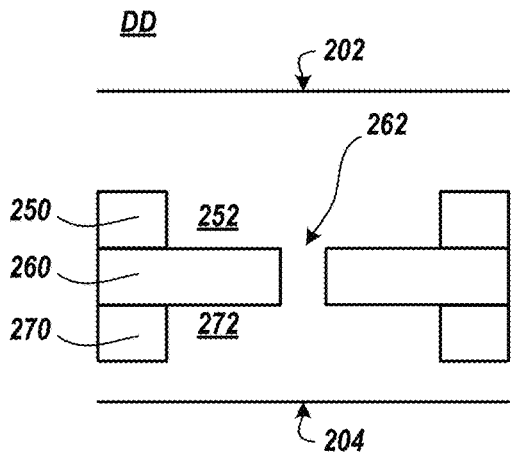 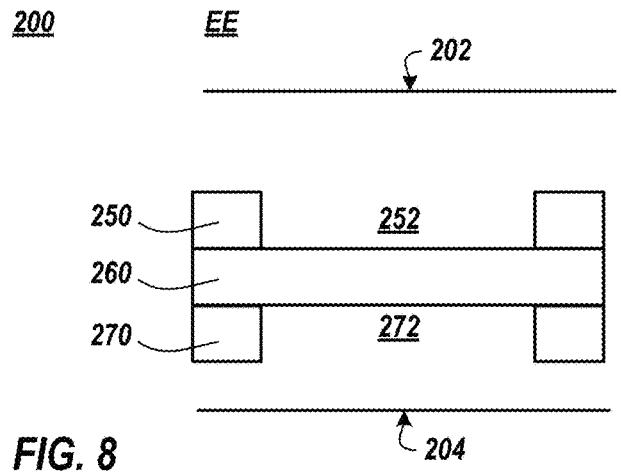
FIG. 8
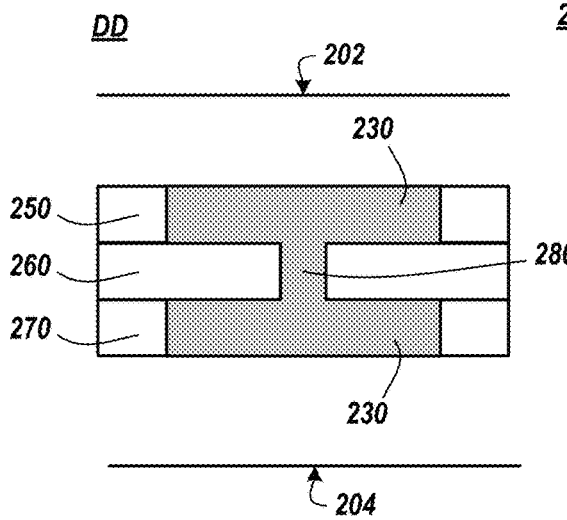 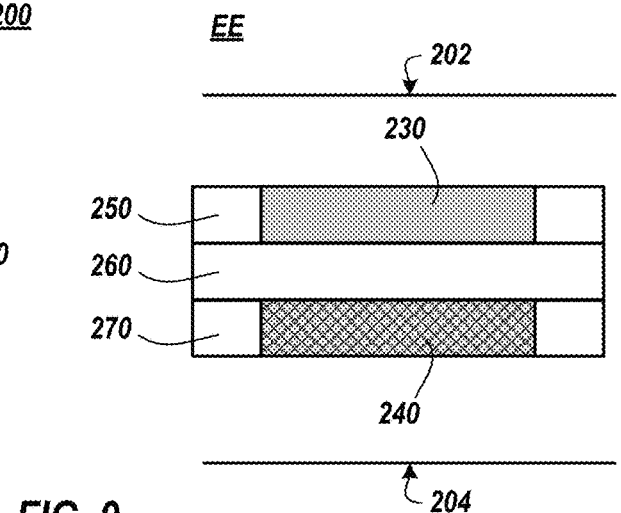
FIG. 9

CONNECTED PLANE STIFFENER WITHIN INTEGRATED CIRCUIT CHIP CARRIER

FIELD OF THE EMBODIMENTS

Embodiments of the present invention generally relate to electronic components, such as an electronic package, that include an integrated circuit (IC) chip carrier with a connected plane stiffener there within.

DESCRIPTION OF THE RELATED ART

Coefficient of Thermal Expansion (CTE) mismatch of packaging materials causes warpage and bow. Bow is caused by two materials with different CTEs, respectively, being placed against each other. The two materials will either curl uniformly in one direction or uniformly in the other depending on the change of temperature. Warpage is caused by local and global variation of CTEs within a material which leads to material undulations.

Copper may be utilized to fabricate the carrier wiring and has a CTE near 17 ppm/K. Organic build up materials used to fabricate the carrier around the wiring have respective CTEs that vary greatly: from greater than 30 ppm/K to as low as 9 ppm/K.

A known solution to reduce bow and warpage of the carrier is to reduce the overall package CTE to more closely match that of silicon. Another known solution to reduce bow and warpage of the carrier is to balance loading of paired wiring within different wiring layers and smooth loading within a wire in a single wiring layer. Another known solution to reduce bow and warpage of the carrier is to add a stiffer upon the upper surface or lower surface of the carrier.

SUMMARY

In a first embodiment of the present invention, an IC chip carrier is presented. The IC chip carrier includes a plane region. The plane region includes an upper conductive plane separated from a lower conductive plane by a plane separation dielectric layer. The plane region includes a conductive channel via within the plane separation dielectric layer and connected to the upper plane and connected to the lower plane. The upper conductive plane and the lower conductive plane resist bending moments internal to the IC chip carrier and the conductive channel via resists shear forces internal to the IC chip carrier.

In another embodiment of the present invention, a method of fabricating an IC chip carrier is presented. The method includes forming a first plane within a first plane fabrication layer, forming a plane separation layer upon the first plane and upon the first plane fabrication layer, forming a channel via within the plane separation layer and upon the first plane, forming a second plane fabrication layer upon the channel via and upon the plane separation layer, and forming a second plane within the second plane fabrication layer and upon the channel via.

In yet another embodiment of the present invention, an IC chip package is presented. The IC chip package includes an IC chip connected to an IC chip carrier. The IC chip carrier includes a plane region comprising an upper conductive plane separated from a lower conductive plane by a plane separation dielectric layer. The IC chip carrier also includes a conductive channel via within the plane separation dielectric layer and connected to the upper plane and connected to the lower plane. The upper conductive plane and the lower conductive plane resist bending moments internal to the IC chip carrier and the conductive channel via resists shear forces internal to the IC chip carrier.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 7 depicts a cross section of internal layers at an exemplary fabrication stage of an IC chip carrier that includes one or more embodiments of the present invention.

FIG. 8 depicts a cross section of internal layers at an exemplary fabrication stage of an IC chip carrier that includes one or more embodiments of the present invention.

FIG. 9 depicts a cross section of internal layers at an exemplary fabrication stage of an IC chip carrier that includes one or more embodiments of the present invention.

DETAILED DESCRIPTION

An integrated circuit (IC) chip carrier includes an internal connected plane stiffener. The connected plane stiffener includes a first plane connected to a second plane by a channel via. The first plane is separated from the second plane a plane separation dielectric layer. The channel via is within the plane separation dielectric layer. The first plane and the second plane resist bending moments internal to the IC chip carrier. The channel via resists shear forces internal to the IC chip carrier. The first plane and the second plane may be both power planes that distributes power potential within the IC chip carrier. The first plane and the second plane may be both ground planes that distributes ground potential within the IC chip carrier.

Figure 1:
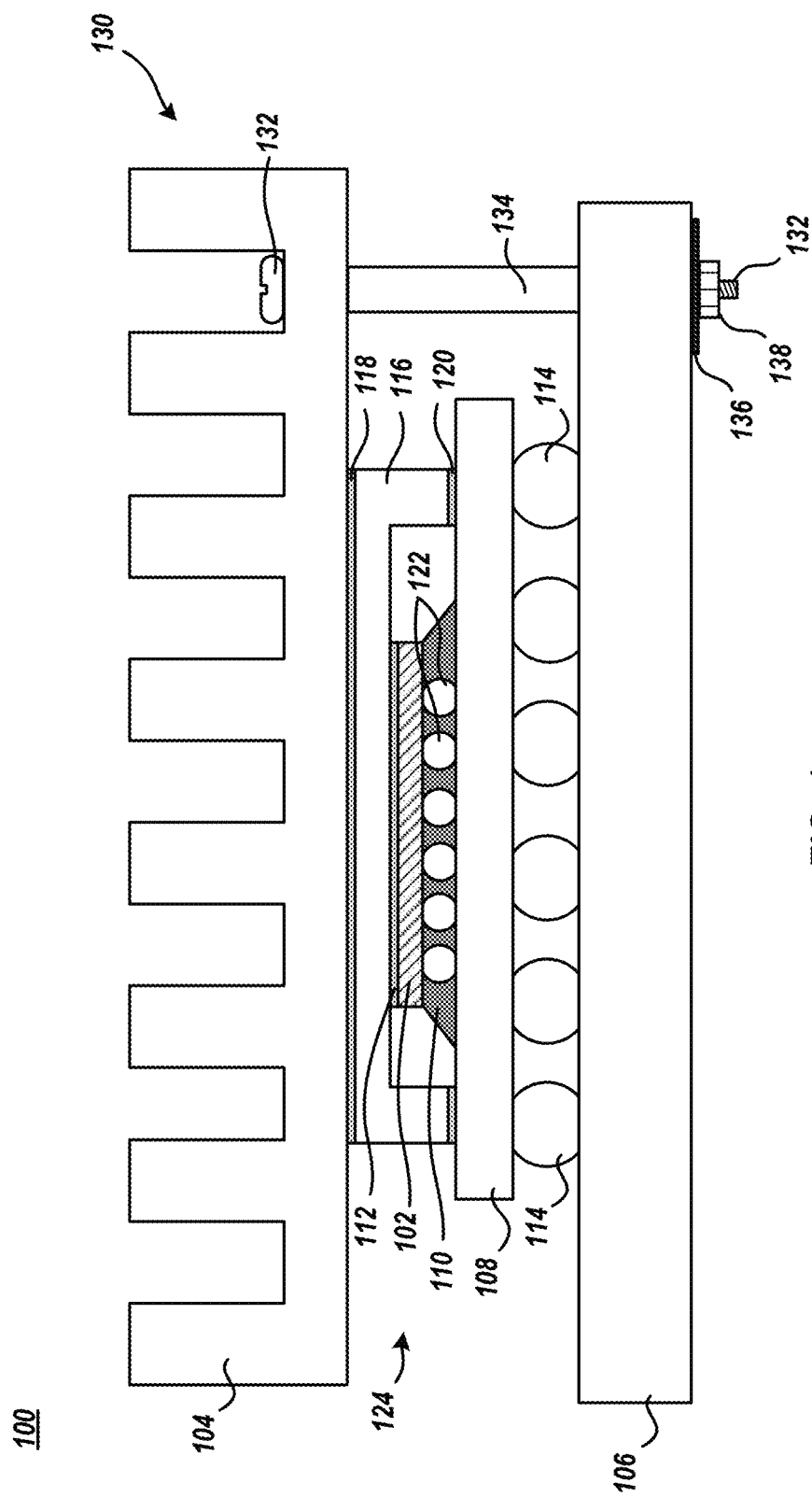
FIG. 1 depicts a cross section of a prior art electronic system.

FIG. 1 depicts a prior art electronic device 100 that includes an IC carrier package 124. Electronic device 100 may be for example a computer, server, mobile device, tablet, and the like. Package 124 includes chip 102, carrier 108, interconnects 122, underfill 110, thermal interface material 112, lid 116, and adhesive 120. Chip 102 may be an IC chip, semiconductor die, processor, microchip, field programmable gate array, or the like. Carrier 108 may be an organic carrier or a ceramic carrier and provides mechanical support for chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, and the like. Underfill 110 may be electrically-insulating, may substantially surround interconnects 122, may isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is seated to carrier 108 a lid 116 is attached to carrier 108 with adhesive 120 to cover chip 102. Generally, during operation of electronic device 100, heat needs to be removed from chip 102. In this situation, lid 116 is both a cover and a conduit for heat transfer. As such, a thermal interface material 112 may thermally join lid 116 and chip 102.

Package 124 may be connected to a motherboard 106 via interconnects 114. Motherboard 106 may be the main printed circuit board of electronic device 100 and includes electronic components, such as a graphics processing unit, memory, and the like, and provides connectors for other peripherals. Interconnects 114 electrically connect the lower side of carrier 108 to motherboard 106 and may be a wire bond, solder bond, stud, conductive ball, conductive button, and the like. Interconnects 114 may be larger and thus more robust than interconnects 122. When package 124 is seated upon motherboard 106 a second reflow process may be performed to join interconnects 114 to electrical contacts of both carrier 108 and motherboard 106. Alternately, a mechanical pressurized interconnect via an intervening socket may be established.

To assist in the removal of heat from chip 102 a heat sink 104 may be thermally joined to package 124 via thermal interface material 118. Heat sink 104 is a passive heat exchanger that cools chip 102 by dissipating heat into the surrounding air. As such, during operation of electronic device 100, a thermal path exists from chip 102 to heat sink 104 through thermal interface material 112, lid 116, and thermal interface material 118, and the like. Heat sink 104 may be connected to motherboard 106 via one or more connection device 130. Connection device 130 may include a threaded fastener 132, standoff 134, backside stiffener 136, and fastener 138. Threaded fastener 132 may extend through heat sink 104, standoff 134, and backside stiffener 136 and provides compressive force between heat sink 104 and backside stiffener 136. The length of standoff 134 may be selected to limit the pressure exerted upon package 124 by heat sink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heat sink 104 upon package 124.

Figure 2:
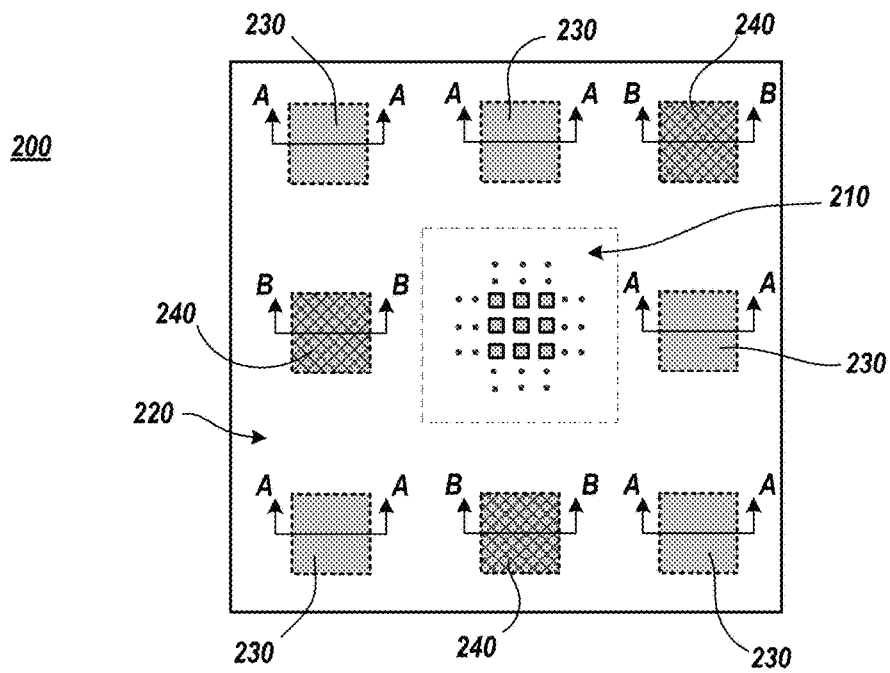
FIG. 2 depicts a normal surface of an IC chip carrier that includes one or more embodiments of the present invention.

FIG. 2 depicts a normal surface of an IC chip carrier 200 that includes one or more embodiments of the present invention. Carrier 200 may be an organic carrier and provides mechanical support for in IC chip. Carrier 200 includes a contact and wiring region 210 that includes an array of contacts arranged in rows and columns upon the upper surface (see upper surface 202 e.g., FIG. 3A) and lower surface (see lower surface 202 e.g., FIG. 3A) of the carrier 200 and includes associated wiring that connect the upper surface contacts with the lower surface contacts. Carrier 200 also includes a plane region 220 that includes one or more power planes 230 and one or more ground planes 240.

A ground plane 240 is a large area or layer (relative to the area of a contact) of conductive material that is electrically connected to a ground point of the carrier 200, ground point of the IC chip, ground point of a motherboard, or the like. Ground plane 240 serves as the return path for current that flows within one or more circuits formed by the wiring of carrier 200.

Ground plane 240 may be made as large as possible, covering most of the area of the carrier 200 which is not occupied by wiring or contacts. In an embodiment, carrier 200 may include a single ground plane 240. In other embodiments, carrier 200 may include multiple ground planes 240 at different locations within the carrier 200. In such embodiments, the different ground planes 240 may be electrically connected to ensure so that the ground connection of different circuits to different ground plane 240 are at the same or substantially similar (i.e. the same within an acceptable tolerance) reference potential.

Power plane 230 is a large area or layer (relative to the area of a contact) of conductive material that is electrically connected to a power point of the carrier 200, ground point of the IC chip, power point of a motherboard, or the like. Power plane 230 serves to distribute power potential that induces current to flow within one or more circuits formed by the wiring of carrier 200.

In an embodiment, carrier 200 may include a single power plane 230. In other embodiments, carrier 200 may include multiple power planes 230 at different locations within the carrier 200. In such embodiments, the different power planes 230 may be electrically connected to ensure so that the power connection of different circuits to different power planes 230 are at the same or substantially similar reference potential.

Generally, one or more ground planes 240 and one or more power planes 230 may be formed within a first layer of the carrier 200 and one or more ground planes 240 and one or more power planes 230 may be formed within a second layer of the carrier. The first layer and second layer may be separated by a plane separation layer.

Carrier 200 may include some locations where a power plane 230 is separated from another power plane 230 by the associated plane separation layer. Similarly, carrier 200 may include other locations where a ground plane 240 is separated from another ground plane 240 by the associated plane separation layer. The locations of carrier 200 in which a plane is separated from a plane of the same type of plane (i.e., a power plane 230 is separated from another power plane 230 or a ground plane 240 is separated from another ground plane 240) are referred to herein as single potential regions.

Likewise, carrier 200 may include some locations where a power plane 230 is separated from a ground plane 240 by a plane separation layer. The locations of carrier 200 in which a plane is separated from a plane of a different type (i.e., a power plane 230 is separated from a ground plane 240) are referred to herein as dual-potential regions.

Generally, the one or more single potential regions and the one or more dual-potential regions are within plane region 220 of carrier 200. Plane region 220 may be a single region of carrier 200 or may be a collective region of distinct regions in which power plane(s) 230 and/or ground plane(s) are fabricated.

Contact and wiring region 210 may be within the center of the carrier 200 with respect to a normal view of carrier 200, as is shown in FIG. 2. Plane region 220 may be at the perimeter of carrier 200 around the circumference of the contact and wiring region 210.

Figure 3A:
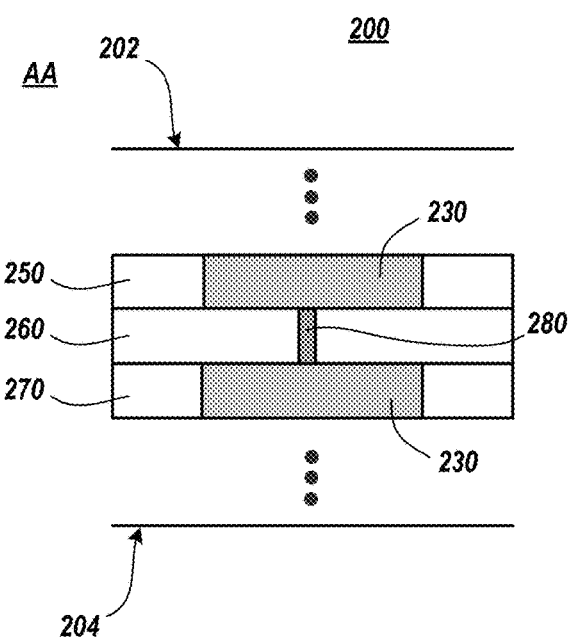
FIGS. 3A and 3B depicts a cross section of an IC chip carrier that includes one or more embodiments of the present invention.

FIG. 3A depicts an exemplary cross-section AA of IC chip carrier 200. In the depicted embodiment, carrier 200 includes a plane fabrication dielectric layer 250, a plane separation dielectric layer 260, and a plane fabrication dielectric layer 270. Such layers 250, 260, and 270 are internal layers of carrier 200 and as such, are between the periphery layers associated with upper surface 202 and lower surface 204 of carrier, respectively. The cross-section AA denoted by FIG. 3A is a cross-section of a single potential region within carrier 200 wherein a power plane 230 within plane fabrication dielectric layer 250 is separated by another power plane 230 within plane fabrication dielectric layer 270 by plane separation dielectric layer 260.

In such exemplary single potential region within carrier 200 depicted in FIG. 3A, a channel via 280 may connect the power plane 230 within plane fabrication dielectric layer 250, which may be referred to as an upper power plane, and the power plane 230 within plane fabrication dielectric layer 270, which may be referred to as a lower power plane. The upper power plane and the lower power plane resist bending moments within carrier 200 while the channel via 280 resists shear forces within carrier 200. As such, the interconnected upper power plane, channel via 280, and lower power plane stiffens the carrier 200.

Figure 3B:
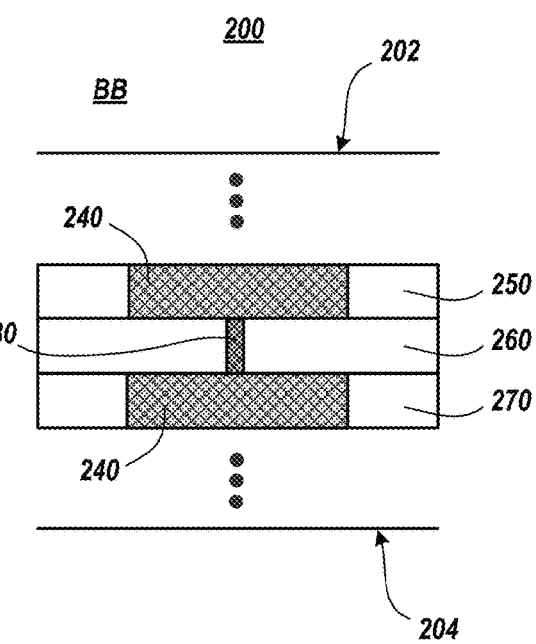

FIG. 3B depicts an exemplary cross-section BB of IC chip carrier 200. In the depicted embodiment, carrier 200 includes a plane fabrication dielectric layer 250, a plane separation dielectric layer 260, and a plane fabrication dielectric layer 270. Such layers 250, 260, and 270 are internal layers of carrier 200 and as such, are between the periphery layers associated with upper surface 202 and lower surface 204 of carrier, respectively. The cross-section BB denoted by FIG. 3B is a cross-section of a single potential region within carrier 200, wherein a ground plane 240 within plane fabrication dielectric layer 250 is separated by another ground plane 240 within plane fabrication dielectric layer 270 by plane separation dielectric layer 260.

In such exemplary single potential region within carrier 200 depicted in FIG. 3B, a channel via 280 may connect the ground plane 240 within plane fabrication dielectric layer 250, which may be referred to as an upper ground plane, and the ground plane 240 within plane fabrication dielectric layer 270, which may be referred to as a lower ground plane. The upper ground plane and the lower ground plane resist bending moments while the channel via 280 resists shear forces. As such, the interconnected upper ground plane, channel via 280, and lower ground plane stiffens the carrier 200.

Generally, the structure of separated planes connected by a channel via may be referred herein as a connected plane stiffener.

Figure 4A:
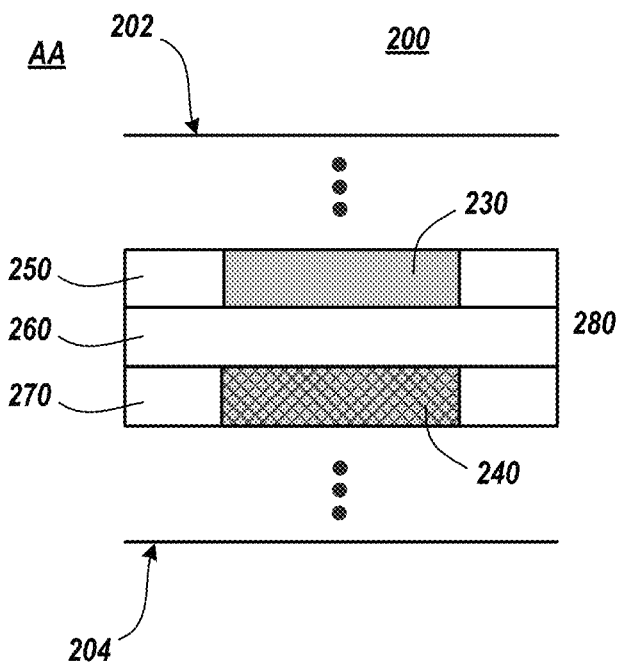
FIGS. 4A and 4B depicts a cross section of an IC chip carrier that includes one or more embodiments of the present invention.

FIG. 4A depicts another exemplary cross-section AA of IC chip carrier 200. In the depicted embodiment, carrier 200 includes a plane fabrication dielectric layer 250, a plane separation dielectric layer 260, and a plane fabrication dielectric layer 270. Such layers 250, 260, and 270 are internal layers of carrier 200 and as such, are between the periphery layers associated with upper surface 202 and lower surface 204 of carrier, respectively. The cross-section AA denoted by FIG. 4A is a cross-section of a dual potential region within carrier 200 wherein a power plane 230 within plane fabrication dielectric layer 250 is separated by a ground plane 240 within plane fabrication dielectric layer 270 by plane separation dielectric layer 260. In such exemplary dual potential region within carrier 200 depicted in FIG. 4A, a channel via 280 is not formed to connect the power plane 230 and the ground plane 240.

Figure 4B:
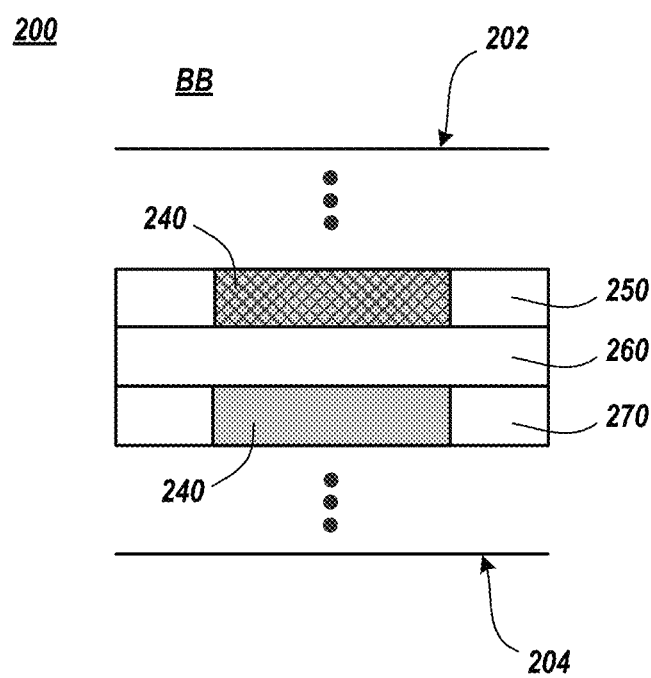

FIG. 4B depicts another exemplary cross-section BB of IC chip carrier 200. In the depicted embodiment, carrier 200 includes a plane fabrication dielectric layer 250, a plane separation dielectric layer 260, and a plane fabrication dielectric layer 270. Such layers 250, 260, and 270 are internal layers of carrier 200 and as such, are between the periphery layers associated with upper surface 202 and lower surface 204 of carrier, respectively. The cross-section BB denoted by FIG. 4B is a cross-section of a dual potential region within carrier 200 wherein a ground plane 240 within plane fabrication dielectric layer 250 is separated by a power plane 230 within plane fabrication dielectric layer 270 by plane separation dielectric layer 260. In such exemplary dual potential region within carrier 200 depicted in FIG. 4B, a channel via 280 is not formed to connect the power plane 230 and the ground plane 240.

Figure 5:
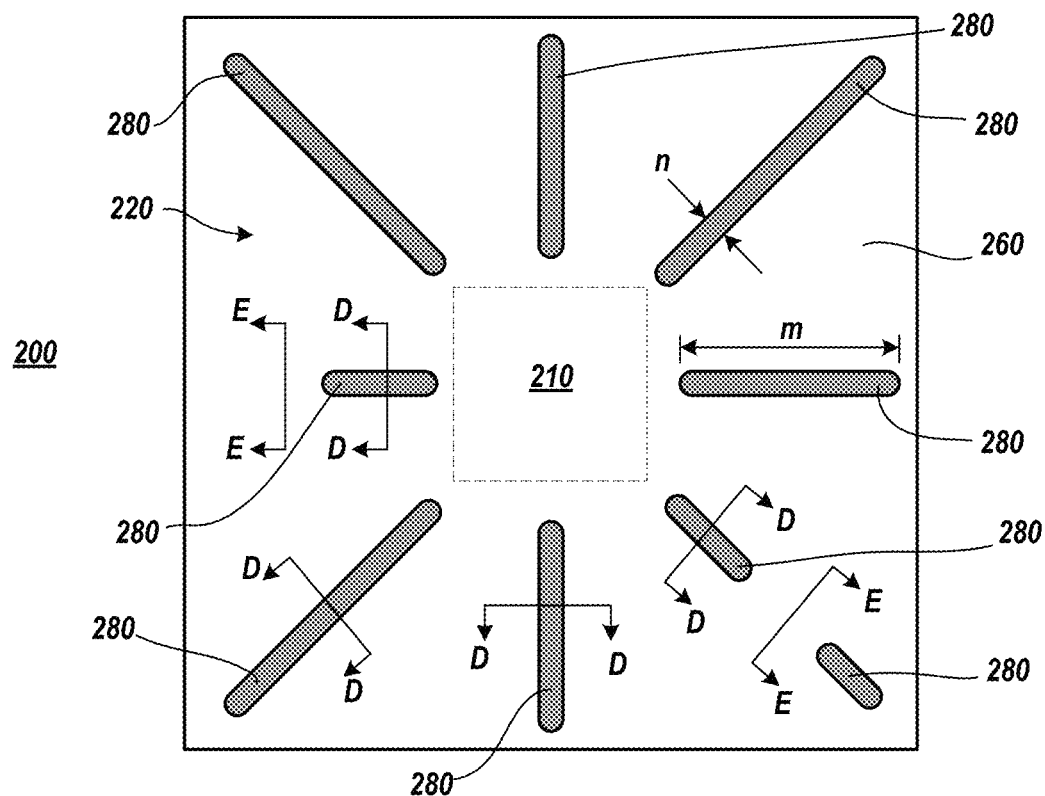
FIG. 5 depicts a normal surface of an internal layer of an IC chip carrier that includes one or more embodiments of the present invention.

FIG. 5 depicts a normal surface of plane separation dielectric layer 260 of IC chip carrier 200. Denoted cross sections DD are exemplary single potential regions, wherein the same plane type is above and below the plane separation dielectric layer 260 and as such, a channel via 280 may be formed to interconnect the separated planes. Denoted cross sections EE are exemplary dual potential regions, wherein different plane types are above and below the plane separation dielectric layer 260 and as such, a channel via 280 is not formed to interconnect the separated planes. In the depicted implementation, straight channel vias 280 are formed of a conductive material and each have a length "m" greater than a width "n." As depicted in FIG. 5, numerous substantially straight channel vias 280 may be formed into a radial star pattern, such that a bisector of each channel via 280 through width n is coincident with the center of carrier 200.

Figure 6:
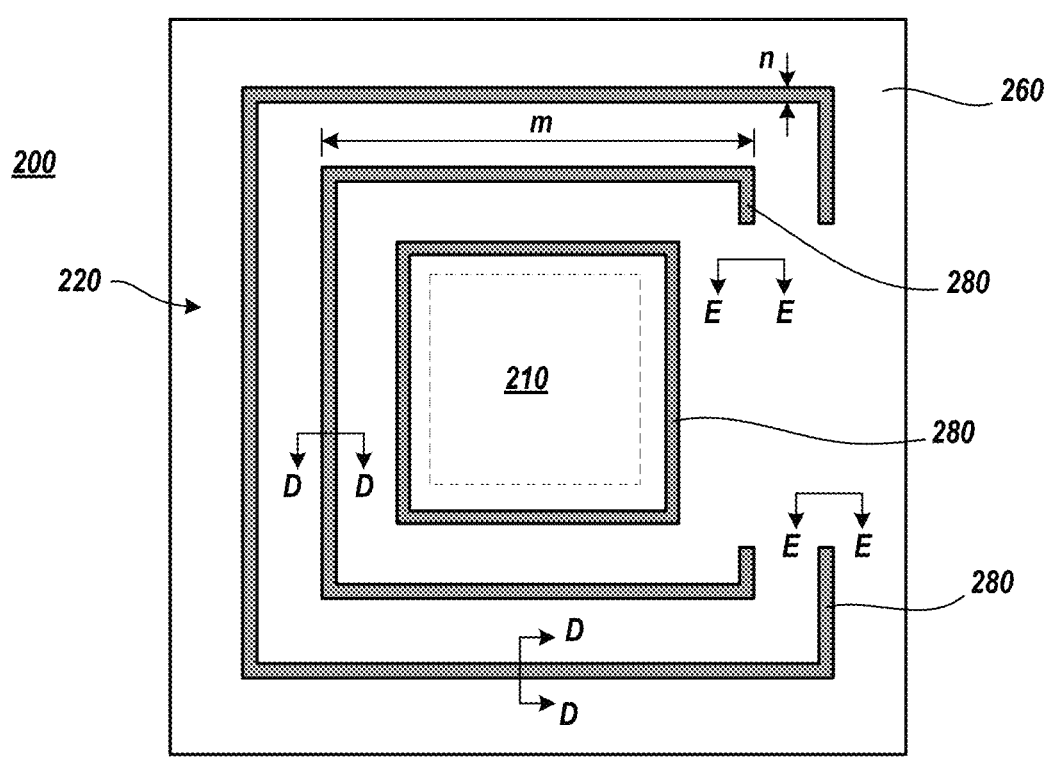
FIG. 6 depicts a normal surface of an internal layer of an IC chip carrier that includes one or more embodiments of the present invention.

FIG. 6 depicts a normal surface of plane separation dielectric layer 260 of IC chip carrier 200. Denoted cross sections DD are exemplary single potential regions, wherein the same plane type is above and below the plane separation dielectric layer 260 and as such, a channel via 280 may be formed to interconnect the separated planes. Denoted cross sections EE are exemplary dual potential regions, wherein different plane types are above and below the plane separation dielectric layer 260 and as such, a channel via 280 is not formed to interconnect the separated planes. In the depicted implementation, shaped channel vias 280 are formed of a conductive material with each via 280 having one or more sections that have a length "m" greater than the width "n" of the via 280.

As depicted in FIG. 6, numerous substantially square channel vias 280 may be formed, such that the center of each channel via 280 is coincident with the center of carrier 200, such that each channel via 280 has a different radius from the center of carrier 200 to be concentric therewith. Though the shape of the vias 280 are shown in FIG. 6 as square, the shape of vias 280 may take on any shape concentric with the center of carrier 200. For example, the shape of vias 280 may be polygonal, circular, or the like.

Generally, in such implementations as shown in FIG. 5 and FIG. 6 the shape of channel vias 280 may may be predetermined. However, in other implementations, channel vias 280 may take the form of any shape where ever there is room or space for such vias 280 within single potential regions within carrier 200. For clarity in either implementation type, each channel via 280 generally has one or more sections with a length "m" greater than width "n" of the channel via 280. Generally, the width of channel via 280 may equal the thickness of separation dielectric layer 260, may be smaller than the thickness of separation dielectric layer 260, or may be larger than the thickness of separation dielectric layer 260.

FIG. 7 depicts a cross section of internal layers at an exemplary fabrication stage of an IC chip carrier 200. At the present fabrication stage, a plane fabrication dielectric layer 250 has been formed upon one surface of plane separation dielectric layer 260 and a plane fabrication dielectric layer 270 has been formed upon an opposing surface of the plane separation dielectric layer 260. The layer 250 has been patterned to remove a portion of such layer 250 exposing the layer 260 to form a plane trench 252. Likewise, the layer 270 has been patterned to remove a portion of such layer 270 exposing the layer 260 to form a plane trench 272. The plane trench 252 and the plane trench 272 may be formed by known techniques such as subtractive etching, or the like.

FIG. 8 depicts a cross section of internal layers at an exemplary fabrication stage of an IC chip carrier 200. At the present fabrication stage, a channel trench 262 is formed in the plane separation dielectric layer 260 in single potential regions of carrier 200, denoted by plane DD. The channel trench 262 may be formed by subtractive etching, by overlapping vertical drilling (top of page to bottom of page) away layer 260 material in the direction of the desired shape of channel via 280 (into and out of the page), removing layer 260 material in the direction of the desired shape of channel via 280 (into and out of the page) by routing, laser, or other removal technique, or the like.

FIG. 9 depicts a cross section of internal layers at an exemplary fabrication stage of an IC chip carrier that includes one or more embodiments of the present invention.

At the present fabrication stage, a channel via 280 in the channel trench 262 of plane separation dielectric layer 260, a power plane 230 in the plane trench 252 of layer 250, and a power plane 230 in the plane trench 272 of layer 270 are simultaneously formed in single potential regions of carrier 200, denoted by plane DD, thus forming a connected plane stiffener. For clarity, a respective ground plane 240 may alternatively formed in trenches 252, 272.

Likewise, at the present fabrication stage, a power plane 230 in the plane trench 252 of layer 250 and a ground plane 240 in the plane trench 272 of layer 270 are simultaneously formed in dual potential regions of carrier 200, denoted by plane EE.

Channel via 280, power plane(s) 230, and/or ground plane(s) 240 may be formed by known techniques such as plating, or the like.

Figure 10A:
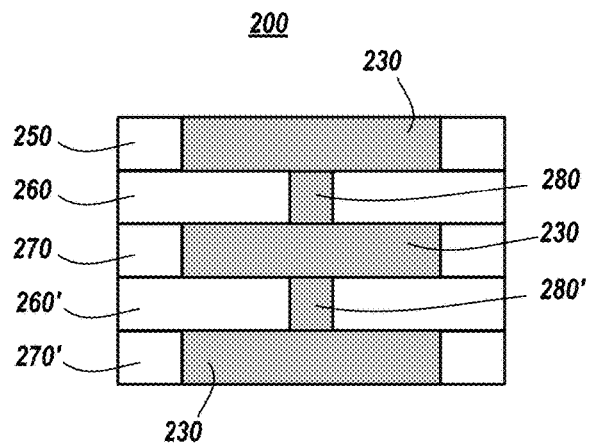
FIGS. 10A and 10B each depicts a cross section of internal layers at an exemplary fabrication stage of an IC chip carrier that includes one or more embodiments of the present invention.

FIG. 10A depicts a cross section of internal layers of IC chip carrier 200. In a single potential region, a first connected plane stiffener (e.g., power plane 230 in layer 250, channel via 280, and power plane 230 in layer 270) may be formed above a second connected plane stiffener (e.g., power plane 230 in layer 70, channel via 280', and power plane 230 in layer 270'). Generally, two or more connected plane stiffener in a single potential region may share a plane (e.g., power plane in layer 270 is shared by both interconnected separated plane structures).

Figure 10B:
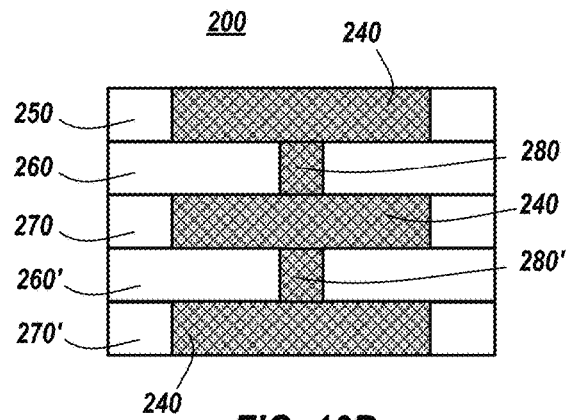

FIG. 10B depicts a cross section of internal layers of IC chip carrier 200. In a single potential region, a first connected plane stiffener (e.g., ground plane 240 in layer 250, channel via 280, and ground plane 230 in layer 270) may be formed above a second connected plane stiffener (e.g., ground plane 240 in layer 270, channel via 280', and ground plane 240 in layer 270'). Generally, two or more connected plane stiffener in a single potential region may share a plane (e.g., ground plane 240 in layer 270 is shared by both interconnected separated plane structures).

Figure 11:
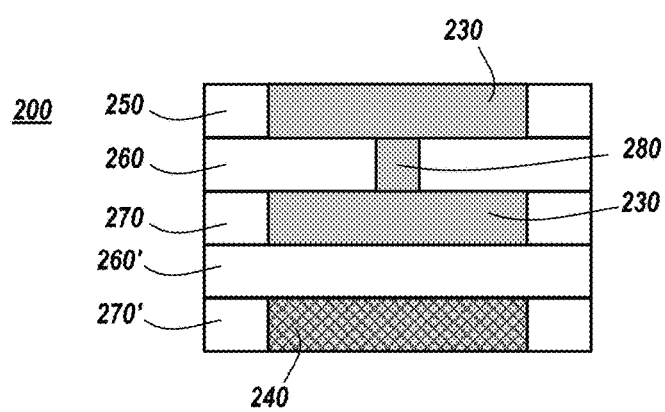
FIG. 11 depicts a cross section of internal layers at an exemplary fabrication stage of an IC chip carrier that includes one or more embodiments of the present invention.
Figure 12:
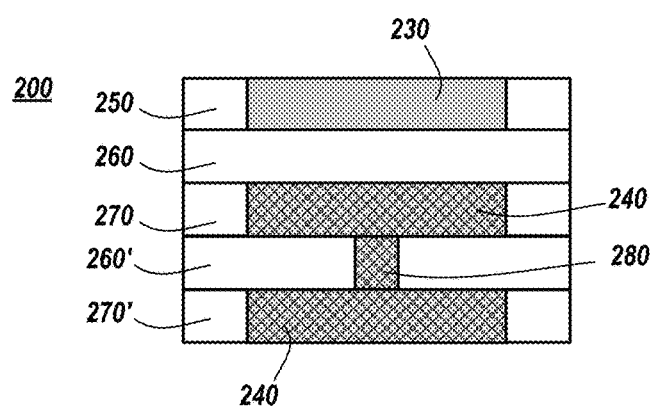
FIG. 12 depicts a cross section of internal layers at an exemplary fabrication stage of an IC chip carrier that includes one or more embodiments of the present invention.

In some implementations, a single potential region is above or below a dual potential region within carrier 200 as is shown in FIGS. 11 and 12.

FIG. 11 depicts a cross section of internal layers of IC chip carrier 200. As depicted, a first connected plane stiffener (e.g., power plane 230 in layer 250, channel via 280, and power plane 230 in layer 270) may be formed within a single potential region of carrier 200 above a separated plane structure (e.g., power plane 230 in layer 270 and ground plane 240 in layer 270') within a dual potential region of carrier 200.

FIG. 12 depicts a cross section of internal layers of IC chip carrier 200. As depicted, a separated plane structure (e.g., power plane 230 in layer 250 and ground plane 240 in layer 270) may be formed within a dual potential region of carrier 200 above a connected plane stiffener (e.g., ground plane 240 in layer 270, channel via 280, and ground plane 240 in layer 270') formed within a single potential region of carrier 200.

For clarity, with regards to FIGS. 10A, 10B, 11, and 12, the shape or pattern of one or more channel vias 280 within layer 260 may be the same relative to the shape of one or more channel vias 280 within layer 260'. For example, a radial star pattern of channel vias 280 may be formed within layer 260 (e.g., the pattern of FIG. 5) and a radial star pattern of channel vias 280 (e.g., the pattern of FIG. 5) may be formed within layer 260' within single potential regions of carrier 200. Similarly, a concentric shape pattern of channel vias 280 may be formed within layer 260 (e.g., the pattern of FIG. 6) and a concentric shape pattern of channel vias 280

(e.g., the pattern of FIG. 6) may be formed within layer 260' within single potential regions of carrier 200.

Alternatively, the shape or pattern of one or more channel vias 280 within layer 260 may be different relative to the shape of one or more channel vias 280 within layer 260'. For example, a radial star pattern of channel vias 280 may be formed within layer 260 (e.g., the pattern of FIG. 5) and a concentric shape pattern of channel vias 280 (e.g., the pattern of FIG. 6) may be formed within layer 260' within single potential regions of carrier 200. Similarly, a concentric shape pattern of channel vias 280 may be formed within layer 260 (e.g., the pattern of FIG. 6) and a radial star pattern of channel vias 280 (e.g., the pattern of FIG. 5) may be formed within layer 260' within single potential regions of carrier 200.

Figure 13:
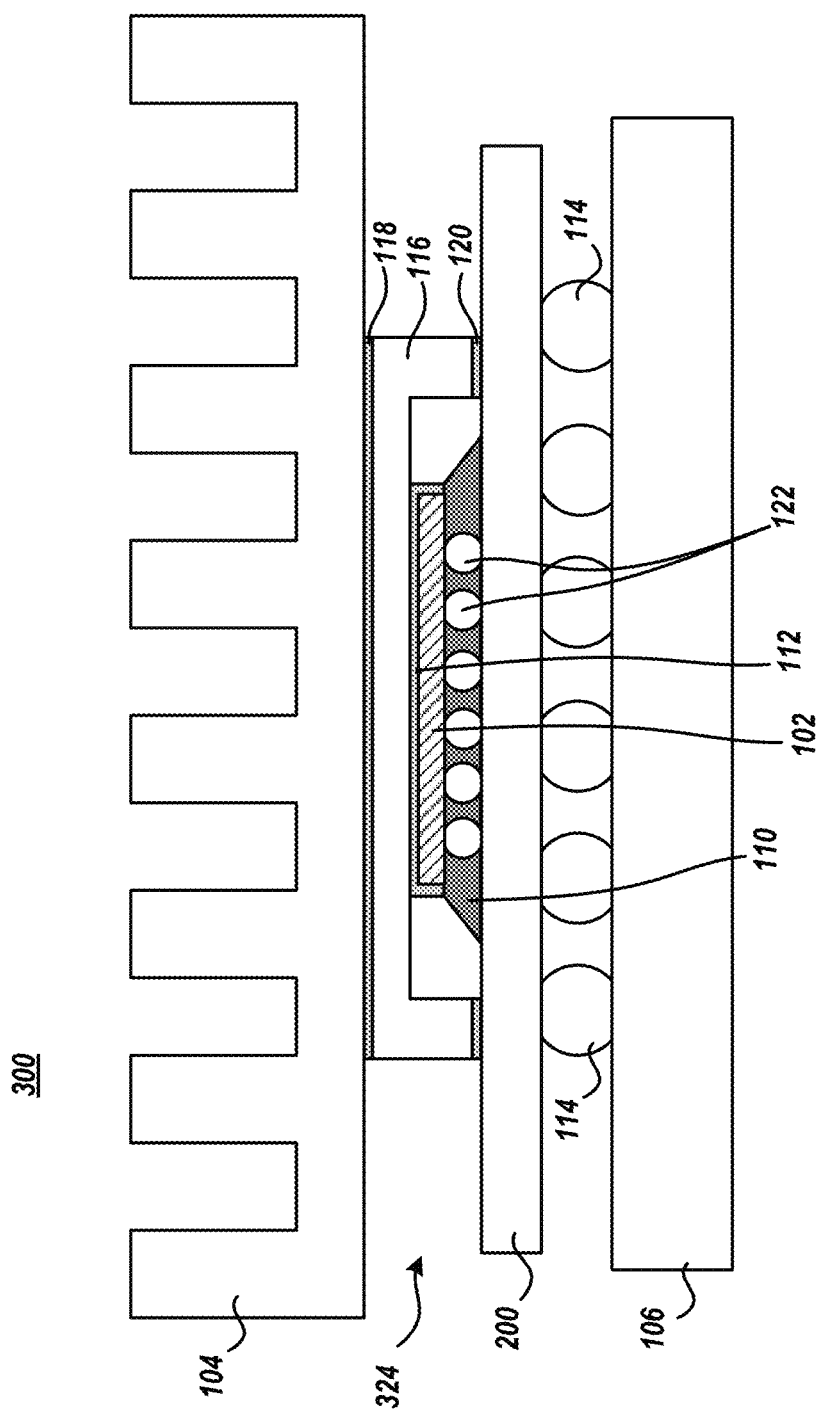
FIG. 13 depicts a cross section of an electronic system that includes an IC chip carrier that includes one or more embodiments of the present invention.

FIG. 13 depicts a cross section of an electronic system 300 that includes an IC chip carrier 200. Because of one or more connected plane stiffeners within single potential regions of carrier 200, the stiffness of carrier 200 is increased. Thus, the connected plane stiffeners of carrier 200, may reduce warpage and bow of carrier 200.

Electronic device 300 may be for example a computer, server, mobile device, tablet, and the like. Package 324 includes chip 102, carrier 200, interconnects 122, underfill 110, thermal interface material 112, lid 116, and adhesive 120. Carrier 200 provides mechanical support for chip 102 and electrical paths from the upper surface of carrier 200 to the opposing side of carrier 200. Interconnects 122 electrically connect chip 102 and the upper side of carrier 200 and may be a wire bond, solder bond, stud, conductive ball, conductive button, and the like. Underfill 110 may be electrically-insulating, may substantially surround interconnects 122, may isolate individual interconnects 122, and may provide mechanical support between chip 102 and carrier 200. Underfill 110 may also prevent damage to individual interconnects 122 due to thermal expansion mismatches between chip 102 and carrier 200. Because warpage or bowing of carrier 200 is reduced, so is the probability of defective wetting or other such electrical connections of interconnects 122 with chip 102 and carrier 200. As such, the yield of package 324 may be relatively increased relative to the yield of package 124.

When chip 102 is seated upon carrier 200, a reflow process may be performed to join interconnects 122 to electrical contacts chip 122 and electrical contacts of carrier 200 within region 210. After chip 102 is seated to carrier 200, lid 116 may be attached to carrier 200 with adhesive 120 to cover chip 102. Generally, during operation of electronic device 300, heat needs to be removed from chip 102. In this situation, lid 116 is both a cover and a conduit for heat transfer. As such, a thermal interface material 112 may thermally join lid 116 and chip 102.

Package 324 may be connected to a motherboard 106 via interconnects 114. When package 324 is seated upon motherboard 106 a second reflow process may be performed to join interconnects 114 to electrical contacts of both carrier 200 and motherboard 106.

To assist in the removal of heat from chip 102, a heat sink, such as heat sink 104, or other known heat exchanger, may be thermally joined to package 324 via thermal interface material 118. As such, during operation of electronic device 300, a thermal path exists from chip 102 to the heat sink or heat exchanger through thermal interface material 112, lid 116, and thermal interface material 118, and the like.

Figure 14:
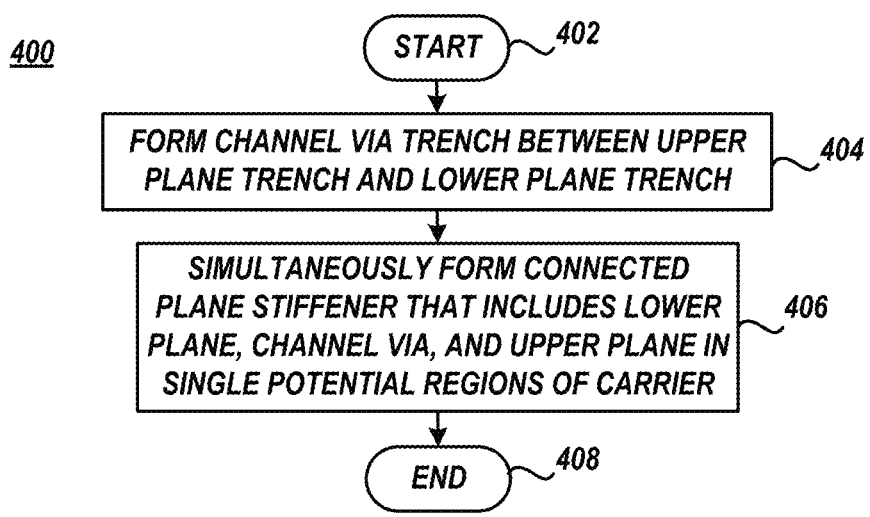
FIG. 14 depicts a method for fabricating an IC chip carrier that includes a connected plane stiffener there within, according to one or more embodiments of the present invention.
Figure 15:
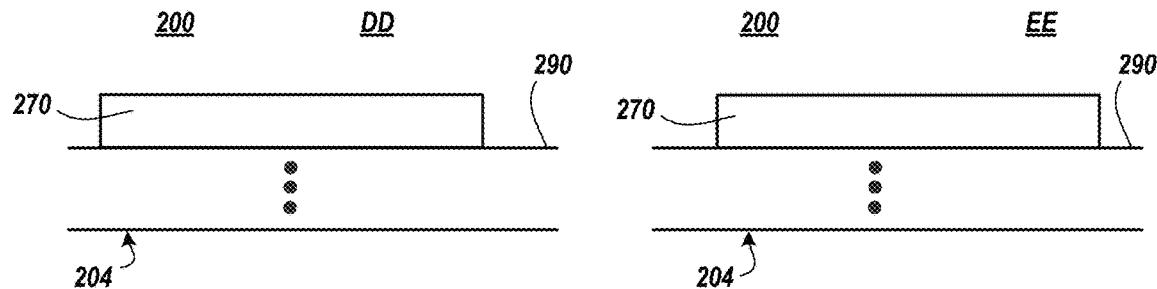
FIG. 15 though FIG. 19 depict a cross section of internal layers at an exemplary fabrication stage of an IC chip carrier that includes one or more embodiments of the present invention.
Figure 16:
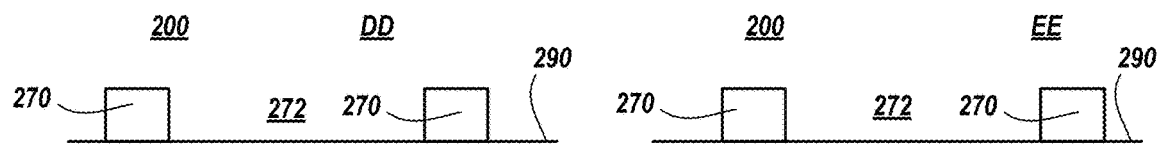
Figure 17:
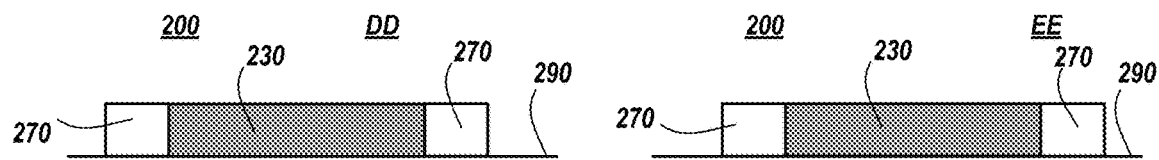
Figure 18:
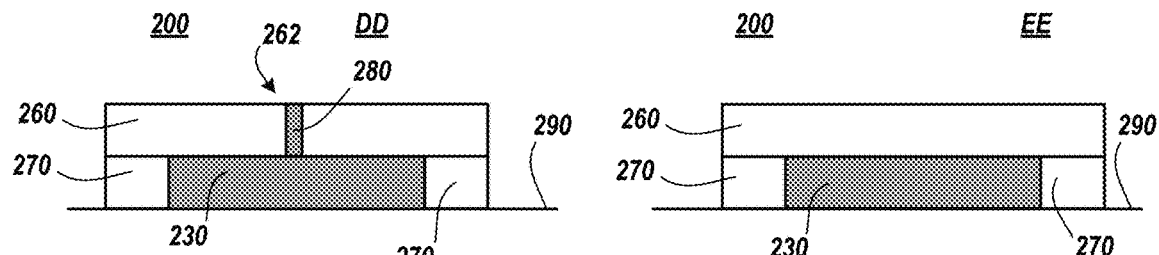
Figure 19:
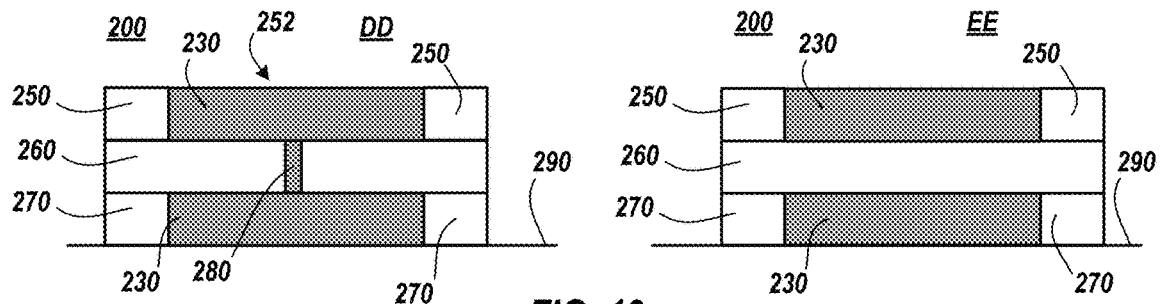
Figure 20:
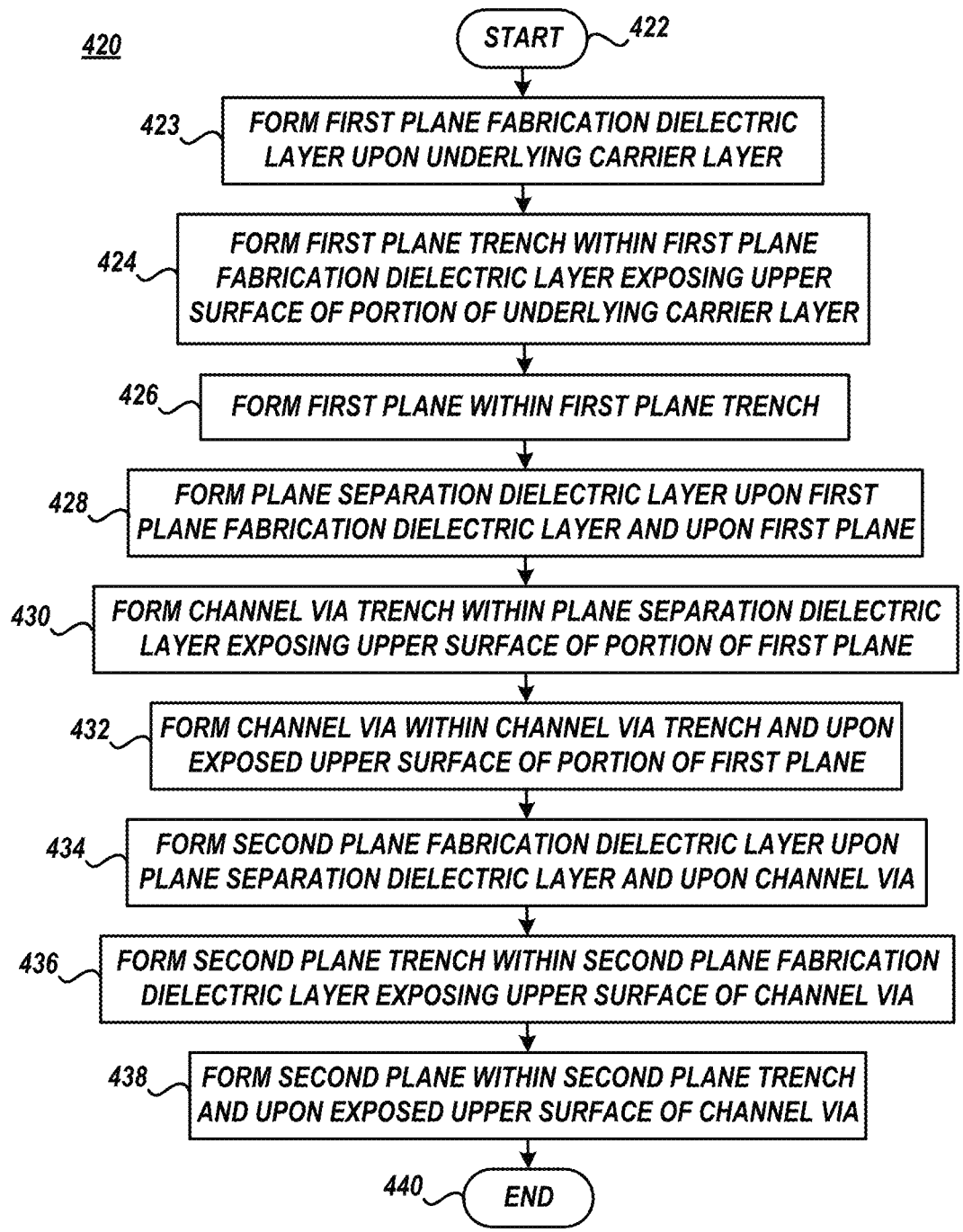
FIG. 20 depicts a method for fabricating a IC chip carrier that includes a connected plane stiffener there within, according to one or more embodiments of the present invention.

FIG. 14 depicts a method 400 for fabricating an IC chip carrier 200 that includes a connected plane stiffener there within, according to one or more embodiments of the present invention. Method 400 starts at block 402 and continues with forming a channel via trench 262 between an upper plane trench 252 and a lower plane trench 272 (block 404). The channel trench 262 may be formed by subtractive etching layer 260 material in the desired shape of channel via 280, by overlapping vertical drilling passes that remove layer 260 material in the desired shape of channel via 280, removing layer 260 material in the direction of the desired shape of channel via 280 by routing, laser, or other removal technique, or the like.

Method 400 may continue with simultaneously forming a connected plane stiffener that includes a plane formed within the upper plane trench 252, a channel via formed within the channel via trench 262, and a plane formed within the lower plane trench 272 in single potential regions of carrier 200 (block 406). The connected plane stiffener may be formed by simultaneously planting conductive material such as copper, aluminum, or the like within upper plane trench 252, channel via trench 262, and lower plane trench 272. Method 400 ends at block 408.

FIG. 15 through FIG. 20 depict fabrication stages of a method 420 to fabricate IC chip carrier 200, respectively, and may be referred to concurrently below.

Method 420 begins a block 422 and continues with forming a first plane fabrication dielectric layer 270 upon an underlying carrier 200 layer 290 (block 423). The present fabrication stage is exemplarily depicted in FIG. 15. Layer 290 may be the layer associated with lower surface 204 or may be another internal carrier 200 layer between the layers associated with lower surface 204 and upper surface 202. Layer 270 may be formed upon layer 290 by known dielectric material formation techniques.

Method 420 may continue with forming a first plane trench 272 within the first plane fabrication dielectric layer 270 exposing an upper surface of a portion of the underlying carrier layer 290 (block 424). The present fabrication stage is exemplarily depicted in FIG. 16. Trench 272 may be formed by removing selective one or more portions of the first plane fabrication dielectric layer 270 using known dielectric removal techniques.

Method 420 may continue with forming a first plane within the first plane trench 272 upon the exposed upper surface of the underlying carrier layer 290 (block 426). The first plane may be either a power plane 230 or a ground plane 240. The present fabrication stage is exemplarily depicted in FIG. 17. The first plane may be formed by using known conductive material formation techniques. For example, the first plane may be formed by plating a metal within trench 272.

Method 420 may continue with forming a plane separation dielectric layer 260 upon the first plane fabrication dielectric layer 270 and upon the first plane (block 428). Layer 260 may be formed upon layer 270 and upon the first plane by known dielectric material formation techniques.

Method 420 may continue with forming a channel via trench 262 within plane separation dielectric layer 260 exposing the upper surface of a portion of the first plane (block 430). The shape of via trench 262 may generally be arbitrary in that the shape of via trench 262 is a requisite shape to stay within the outline of the first plane or the outline of the second plane to be formed there above. The shape of via trench 262 may be apart of a predetermined pattern such as radial start pattern, a concentric shape pattern, or the like. Trench 262 may be formed by removing selective one or more portions of the plane separation dielectric layer 260 using known dielectric removal techniques.

Method 420 may continue with forming a channel via 280 within the channel via trench 262 and upon the exposed upper surface of a portion of the first plane (block 432). The present fabrication stage is exemplarily depicted in FIG. 18. The channel via 280 may be formed by using known conductive material formation techniques. For example, the channel via 280 may be formed by plating a metal within trench 272.

Method 420 may continue with forming a second plane fabrication dielectric layer 250 upon the plane separation dielectric layer 260 and upon the channel via 280 (block 434). Layer 250 may be formed upon layer 260 and upon the channel via 280 by known dielectric material formation techniques.

Method 420 may continue with forming a second plane trench 252 within the second plane fabrication layer 250 exposing the upper surface of channel via 280 (block 436). Trench 252 may be formed by removing selective one or more portions of the second plane fabrication dielectric layer 250 using known dielectric removal techniques.

Method 420 may continue with forming a second plane within the second plane trench and upon the exposed upper surface of channel via 280 (block 438). The second plane is the same type of plane relative to the first plane. The present fabrication stage is exemplarily depicted in FIG. 19. The second plane may be formed by using known conductive material formation techniques. For example, the second plane may be formed by plating a metal within trench 252.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. For example, the order of the fabrication stages listed in depicted blocks may occur out of turn relative to the order indicated in the Figures, may be repeated, and/or may be omitted partially or entirely. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or upper surface 202 of the carrier 200, regardless of the actual spatial orientation of the carrier 206. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:

1. A method of fabricating an integrated circuit (IC) chip carrier comprising a lower surface, an upper surface, and a center, the method comprising:
    forming a first plane fabrication layer upon a lower periphery layer, the lower periphery layer comprising the lower surface of the IC chip carrier;
    forming one or more first planes within the first plane fabrication layer;
    forming a plane separation layer upon the one or more first planes and upon the first plane fabrication layer;
    forming a plurality of channel vias within the plane separation layer and upon the one or more first planes, each channel via comprising a width, a length greater than the width, and a width bisector that is coincident with the center of the IC chip carrier;
    forming a second plane fabrication layer upon the plurality of channel vias and upon the plane separation layer;
    forming one or more second planes within the second plane fabrication layer and upon the plurality of channel vias; and
    forming an upper periphery layer upon the one or more second planes and upon the plane fabrication layer, the upper periphery layer comprising the upper surface of the IC chip carrier.

2. The method of claim 1, wherein the one or more first planes and the one or more second planes resist bending moments internal to the IC chip carrier.

3. The method of claim 1, wherein the plurality of channel vias resist shear forces internal to the IC chip carrier.

4. The method of claim 1, wherein the one or more first planes distributes power potential within the IC chip carrier and wherein the one or more second planes distributes power potential within the IC chip carrier.

5. The method of claim 1, wherein the one or more first planes distributes ground potential within the IC chip carrier and wherein the one or more second planes distributes ground potential within the IC chip carrier.

6. The method of claim 1, wherein forming the one or more first planes within the first plane fabrication layer comprises:
    forming one or more first plane trenches within the first plane fabrication layer; and
    forming one first plane within each first plane trench.

7. The method of claim 1, wherein forming the plurality of channel vias within the plane separation layer and upon the one or more first planes comprises:
    forming a plurality of channel via trenches within the plane separation layer exposing a portion of an upper surface of the one or more first planes; and
    forming one channel via within each channel via trench upon the exposed portion of the upper surface of the one or more first planes.

8. The method of claim 1, wherein forming the one or more second planes within the second plane fabrication layer and upon the plurality of channel vias comprises:
    forming one or more second trenches within the second plane fabrication layer exposing the plurality of channel vias; and
    forming one second plane within each second plane trench and upon the plurality of channel vias.

* * * * *